United States Patent [19]

Durst

[11] Patent Number: 5,126,568

[45] Date of Patent: Jun. 30, 1992

[54] MAGNETOMETER INPUT CIRCUIT FOR INFRARED DETECTORS

[75] Inventor: David I. Durst, Syossett, N.Y.

[73] Assignee: Grumman Aerospace Corporation, Bethpage, N.Y.

[21] Appl. No.: 732,923

[22] Filed: Jul. 19, 1991

[51] Int. Cl.$^5$ .................................................. G01R 33/035
[52] U.S. Cl. ..................... 250/338.1; 250/349; 324/248; 324/73.1; 307/306
[58] Field of Search .................... 250/338.1, 349; 324/248, 127, 73.1; 307/306, 277, 308, 309, 310, 311

[56] References Cited

U.S. PATENT DOCUMENTS

| | | |
|---|---|---|
| 3,665,196 | 5/1972 | Macall . |
| 3,787,668 | 1/1974 | Currie . |
| 3,907,875 | 7/1976 | Leehan . |
| 3,975,648 | 8/1976 | Tobey . |
| 4,004,148 | 1/1977 | Howard . |
| 4,007,415 | 2/1977 | Toyoda . |
| 4,045,675 | 8/1977 | Kingsley . |
| 4,054,797 | 10/1977 | Milton . |
| 4,064,448 | 12/1977 | Estock . |
| 4,109,522 | 8/1978 | Thompson ............... 250/336.2 |
| 4,115,692 | 9/1978 | Balcerak . |
| 4,152,595 | 5/1979 | Garfinkel . |
| 4,179,691 | 12/1979 | Keller . |
| 4,243,885 | 1/1981 | Agouridis . |
| 4,255,658 | 3/1981 | Hurst . |
| 4,257,057 | 3/1981 | Cheung . |
| 4,303,861 | 12/1981 | Ekstrom . |
| 4,418,335 | 11/1983 | Genahr . |
| 4,431,920 | 2/1984 | Srour . |
| 4,435,652 | 3/1984 | Stevens . |
| 4,496,854 | 1/1985 | Chi et al. ................. 357/5 |
| 4,499,416 | 2/1985 | Koike . |
| 4,633,086 | 12/1986 | Parrish . |
| 4,864,237 | 9/1989 | Hoenig ................... 307/306 |
| 4,875,010 | 10/1989 | Yokosawa et al. .......... 324/248 |

OTHER PUBLICATIONS

Infrared Detectors, Halsted Press Series-IC Regulators Still the Perennial Favorite, "Electronics" 1977.

Primary Examiner—Carolyn E. Fields
Assistant Examiner—Drew A. Dunn
Attorney, Agent, or Firm—Stetina & Brunda

[57] ABSTRACT

A method and an input circuit are disclosed for interfacing infrared detector elements to signal processing circuitry. The input circuit comprises a current loop for generating a magnetic field and a sensing circuit for measuring the strength of the field. Both the current loop and the sensing circuit are fabricated proximate each other. The current loop is connectable to an infrared detector such that the magnetic field generated by the current loop is proportional to the output of the infrared detector element. The input circuit isolates the detector element from bias voltages generated by the associated input circuitry and therefor reduces 1/f noise.

9 Claims, 1 Drawing Sheet

MAGNETOMETER INPUT CIRCUIT FOR INFRARED DETECTORS

FIELD OF THE INVENTION

The present invention relates generally to input circuits for interfacing low level signals from transducers to signal processing circuitry and more particularly to a method and an input circuit comprising a current loop and magnetometer for interfacing infrared detector elements to signal processing circuitry.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range corresponding to the particular detection function of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation can be derived.

Photo-type detectors (e.g., photoconductive and photovoltaic detectors), absorb the infrared frequency energy directly into the electronic structure of the material, inducing an electronic transition which leads to a change in the electrical conductivity (photoconductors) or to the generation of an output voltage across the terminals of the detector (photovoltaic detectors). The precise change that is affected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, advances in semiconductor materials and the development of highly sensitive electronic circuitry have advanced the performance of contemporary infrared detectors close to the ideal photon limit.

Current infrared detection systems incorporate arrays of large numbers of discrete, highly sensitive detector elements, the outputs of which are connected to sophisticated processing circuitry. By rapidly analyzing the pattern and sequence of detector element excitation, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a detector connecting module that performs at least a portion of the signal processing functions within a module, i.e. on integrated circuit chips disposed adjacent the detector focal plane, the signal from each detector need be transmitted only a short distance before processing. As a consequence of such on focal plane or up front signal processing, reductions in size, power and cost of the main processor may be achieved. Moreover, up front signal processing helps alleviate performance, reliability and economic problems associated with the construction of millions of closely spaced conductors connecting each detector element to the main signal processing network.

Limitations on the performance of contemporary infrared detectors arise due to the presence of noise intermixed with the signal generated by the detector. In general, such noise may be a consequence of background conditions at the site of the detector, generated from within the detector itself, or generated as a consequence of the interconnected electronic circuitry. Unless eliminated from the detected signal, noise components establish the minimum level of detectivity obtainable from the detection circuit.

Cooling the detector to extremely low temperatures is effective to reduce random electronic activity within the detector and therefore reduce some components of the noise spectrum. Filters and well known electronic signal processing techniques are also effective to reduce background noise levels, permitting enhancement of the signal-to-noise ratio of the detector circuit.

One type of noise that is particularly significant when the detector operates in certain regions of the infrared frequency spectrum is commonly referred to as flicker noise, or 1/f noise. The term 1/f noise generally refers to noise in the semiconductor detector that is due to modulation of the detector conductivity. 1/f noise increases dramatically as the biasing voltage across the detector increases. Because 1/f noise can be the principal noise component at certain frequencies of operation, it is highly desirable that the detector bias voltage be reduced as much as possible while retaining high gain and low power levels in the detector circuit.

Although prior art circuits have been proposed that provide zero bias voltage across the infrared detector to reduce 1/f noise, those circuits suffer from one or more common deficiencies. One of those deficiencies concerns the ability of the circuit to achieve the desired operating point, i.e. at the zero bias condition and to maintain that desired operating point over time. Another deficiency concerns the ability of the circuit to achieve the desired operating point uniformly over a large number of inputs, despite differences in the threshold levels of the particular semiconductors incorporated into the circuit. Variations with regard to those threshold levels, as well as variations in the precise resistance of other components may change the operating conditions such that maximum reduction of noise levels is not consistently obtainable without persistent measurements and adjustments.

Another deficiency of contemporary zero biasing circuits relates to the intrinsic topology of the buffer circuits that are interconnected to the detectors. Ideally buffer circuits should operate at very small signal levels and therefore generate discernable output signals upon the application of a small signal upon the gate of the device. Thus, power consumption and power dissipation requirements should be minimized without sacrificing sensitivity to low level inputs. Some existing buffer circuits incorporate semiconductor devices such as bipolar transistors, which suffer from the requirement that too large a current must be applied to the base in order to turn on the circuit. Thus sensitivity is reduced in such buffer circuits. Other circuits that incorporate devices operating in a normally on condition, i.e. above threshold, may draw too much current when activated by a signal responsive to irradiation of the detector.

Contemporary zero biasing circuits typically function by first sensing a drift in the bias, which results in a non-zero bias, and then correcting the non-zero bias condition. Therefore, a non-zero bias condition exists momentarily prior to the correction. This results in a time variation of the detector bias and consequently generation of a 1/f noise component. Bias voltages are continuously applied to the detector element by signal processing circuitry and these bias voltages are continuously compensated for by the contemporary zero biasing circuits.

It would be desirable to isolate the detector element from the effects of biasing voltages generated by signal processing circuitry and thereby eliminate the effects of such biasing voltages upon detector elements.

In view of the shortcomings of the prior art, it is desirable to provide an input circuit which isolates the detector element from the bias voltage generated by the signal processing circuitry and therefore which reduces 1/f noise.

As such, although the prior art has recognized to a limited extent the problem of the generation of 1/f noise due to bias voltages generated by signal processing circuitry, the proposed solutions have to date been ineffective in providing a satisfactory remedy.

SUMMARY OF THE INVENTION

The present invention comprises a method and an input circuit for interfacing infrared detector elements to signal processing circuitry. The input circuit comprises a current loop for generating a magnetic field and a magnetometer for measuring the strength of the field. Both the current loop and the magnetometer are fabricated upon a common semiconductor substrate. The current loop is connectable to an infrared detector such that the magnetic field generated by the current loop is proportional to the output of the infrared detector element. The magnetometer comprises a high temperature superconductor sensing element and provides an output having a sufficient level to be utilized by signal processing circuitry. The magnetometer input circuit isolates the detector element from bias voltages generated by the associated input circuitry, e.g. an input amplifier. The magnetometer input circuit therefore reduces 1/f noise by eliminating the effects of the bias voltages upon the detector element.

DETAILED DESCRIPTION OF THE PREFERRED EMBODIMENT

The detailed description set forth below in connection with the appended drawings is intended merely as a description of the presently preferred embodiments of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

Figure 1:
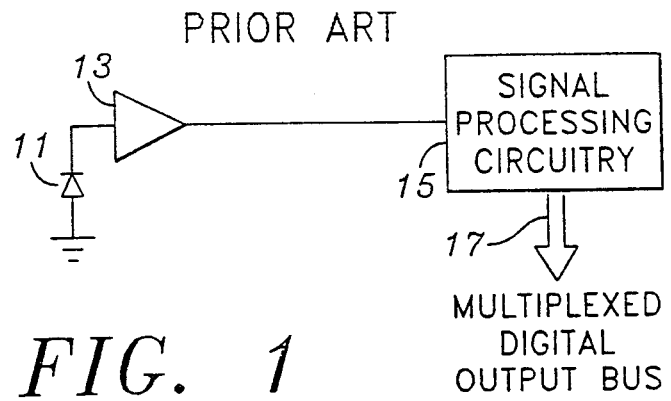
FIG. 1 is an electrical block diagram of a prior art infrared detector element input circuit.
Figure 2:
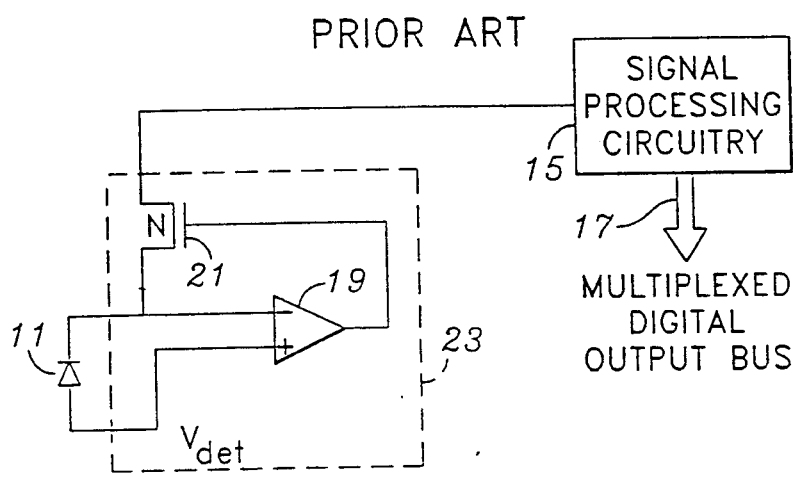
FIG. 2 is an electrical block diagram of a prior art infrared detector input circuit having a zero biasing network.
Figure 3:
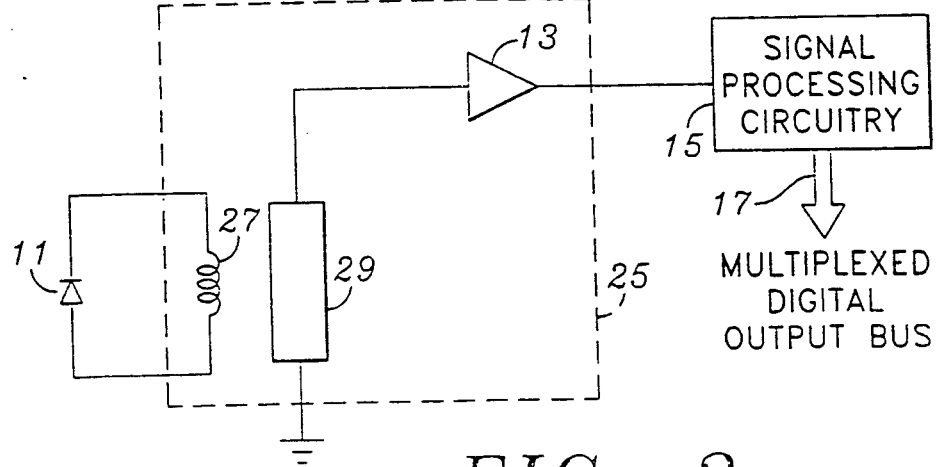
FIG. 3 is an electrical block diagram of the magnetometer input circuit for infrared detectors of the present invention.

The magnetometer input circuit for infrared detectors of the present invention is illustrated in FIG. 3. FIGS. 1 and 2 illustrate prior art infrared detector input circuits.

Referring now to FIG. 1, the simplest infrared detector element input circuit is comprised of an input amplifier 13 connected to the output of a detector element 11. The input amplifier 13 amplifies the level of the detector element 11 output to a level sufficient for processing by signal processing circuitry 15. The signal processing circuitry typically comprises high and/or low pass filtering, further amplification, tuned bandpass filtering, clutter and background rejection, fixed noise pattern suppression, multiplexing, and/or analog-to-digital conversion. A multiplexed digital signal is output from the signal processing circuitry 15 to a multiplexed digital output bus 17.

Such prior art input circuits inherently apply a bias voltage across the detector element 11. This bias voltage is generated by the inherent offsets within the input amplifier 13 in FIG. 1. The bias voltage causes the generation of 1/f noise by causing a bias current to flow which modulates the conductivity of the detector 11. 1/f noise increases dramatically as the biasing voltage across the detector element 11 increases. This 1/f noise can be the principal noise component at certain frequencies of operation. Therefore, it is highly desirable that the detector element 11 biasing voltage be reduced as much as possible while retaining high gain and low power levels in the detector circuit.

Referring now to FIG. 2, a prior art circuit for reducing detector element biasing voltage, and consequently 1/f noise, is depicted. This prior art circuit consists of a differential input amplifier 19 connected across the infrared detector 11 and supplying an output to the gate of a field effect transistor 21. The source of the field effect transistor 21 is connected to the negative electrode of the infrared detector element 11. The drain of the field effect transistor 21 is connected to signal processing circuitry 15 as in FIG. 1. The differential input amplifier 19 and the field effect transistor 21 form a biasing network 23 which is operative to reduce variations in the input power levels and to communicate a low level bias signal to the infrared detector element 11. The differential amplifier 19 is adapted to operate at a constant current level. The field effect transistor 21 is operative to receive at its gate any current output from the differential amplifier 19 in excess of the fixed current. The excess current is translated into a negative feedback signal by the field effect transistor 21. The negative feedback signal is applied to the negative electrode of the detector element 11, thus maintaining an approximately zero bias voltage across the detector element 11.

In the input circuit of FIG. 2 the detector element 11 is connected directly to the differential input amplifier 19 and therefore is subject to having voltage potentials applied to its electrodes which are generated within the differential input amplifier 19. Although the biasing network 23 functions to maintain approximately zero biasing voltage across the infrared detector element 11, this is a feedback process wherein the potential must first be applied across the detector element 11 for the biasing network 23 to re-bias the detector element 11. As the loop gain of the feedback network increases, the bias voltage decreases. However, the loop gain cannot be increased without limit since the network can become unstable. Thus the bias voltage can never be completely eliminated. In addition, the power dissipated by amplifier 19 can be excessive for high gains and wide bandwidths, thus limiting the performance of this approach.

Additionally, in an array the bias across each infrared detector element channel is different since each detector element is connected to dedicated signal processing circuitry. The dedicated signal processing circuitry for each channel develops different, independent biasing voltages for each detector element. Having different amounts of 1/f noise on each channel makes the signal processing of the output signal more difficult.

Referring now to FIG. 3 the magnetometer input circuit for infrared detectors 25 the present invention is depicted. In the preferred embodiment of the present invention a conductor or current loop 27 is connected across the electrodes of the infrared detector element 11. The current loop 27 forms a closed circuit through which current generated by the infrared detector element 11 travels as infrared radiation is detected. A sensing circuit or high temperature super conductor magnetometer 29 is disposed proximate the current loop 27. The output of the high temperature super conductor magnetometer 29 is connected to an input amplifier 13 which is connected to signal processing circuitry 15 as in FIGS. 1 and 2.

As current generated by the infrared detector element 13 flows through the current loop 27 a magnetic field is generated which extends from the current loop 27. The high temperature super conductor magnetometer 29 is an extremely sensitive semiconductor device for sensing magnetic fields and for providing an output proportional to magnetic fields sensed.

In the present invention the high temperature super conductor magnetometer 29 senses the magnetic field generated by the current loop 27 and provides an output signal to the input amplifier 13 which is proportional to the magnetic field generated by the current loop 27. Therefore, the output of the high temperature super conductor magnetometer 29 is proportional to the output of the infrared detector element 13, which in turn is proportional to the intensity of infrared radiation falling on the detector.

As is well known in the art, a conductive current loop or coil can be formed upon a semiconductor substrate by forming a conductive trace through a series of insulating layers. This can be done in either a stair step fashion or by using vias to connect a plurality of loops.

When formed in a stair step fashion, the coil comprises a plurality of conductive traces formed generally in the shape of a semi-circular loop and disposed one above another. Each loop is separated from adjacent loops by insulating layers. The insulating layers are not formed over a portion of each loop at its endpoint such that the trace can stair step from one level to another and thus provide interconnection between loops.

Alternatively, vias could be utilized to interconnect loops and thus form a coil. It is also possible that a single conductive loop could provide an adequate magnetic field for proper sensing by the high temperature magnetometer 29.

A high temperature super conductor magnetometer is comprised of a SQUID or super conducting quantum interference device. As those skilled in the art will recognize, the two varieties of SQUID, the dc SQUID and the rf SQUID, are the most sensitive devices presently available for the measurement of magnetic fields, magnetic field gradients, magnetic susceptibilities, and voltages. The dc SQUIDS commonly consist of two Josephson junctions mounted on a super conducting loop. The device may be constructed of thin films, preferably $Nb-NbO_x-Pb$ junctions which are resistively shunted by a gold strip in order to eliminate hysteresis in the current-voltage characteristic. A current greater than the critical current of the two junctions may be used to bias the SQUID at a non-zero voltage.

The rf SQUID consists of a single Josephson junction on a super conducting ring that is inductively coupled to the coil of a cooled tank circuit. The tank circuit may be excited at its resonant frequency, typically approximately 30 MHz. The rf voltage across the tank circuit is amplified and rectified to produce a voltage.

The use of SQUIDS is no longer limited to low-temperature laboratories. The use of portable fiberglass cryostats which use liquid helium instead of liquid nitrogen make it possible to construct and utilize portable systems for applications including magneto cardiography, magneto encephalography, geophysical surveying, and gravity-wave detection. Those skilled in the art will recognize that various commercially available dc and rf SQUIDS are suitable for use in the practice of the invention. Alternately, the SQUID may be formed as an integrated circuit device of a custom integrated circuit chip.

In the present invention the detector element 11 is not electrically connected to the input amplifier 13 and therefore is not subject to the development of a biasing voltage generated by the input amplifier 13. Rather, the detector element is isolated from the effects of voltages generated within the input amplifier 13. The detector element 11 provides a current output which generates a magnetic field about the current loop 27 and the magnetic field is sensed by the high temperature super conductor magnetometer 29. The high temperature super conductor magnetometer 29 provides an output to the input amplifier 13. Any biasing voltage generated by the input amplifier 13 is applied across the high temperature super conductor magnetometer 29 and does not affect the detector element 11. Thus, 1/f noise is not generated within the detector element 11 by biasing voltages generated within the input amplifier 13. Any dc bias voltage across the detector is due solely to the voltage drop caused by the detector current through the impedance of the current loop. Since this impedance can be made extremely small, the detector bias voltage is minimized.

It is understood that the exemplary magnetometer input circuit for infrared detectors described herein and shown in the drawings represents only a preferred embodiment of the invention. Indeed, various modifications and additions may be made to such embodiment without departing from the spirit and scope of the invention. For example, various means other than a high temperature super conductor magnetometer may be used for sensing the magnetic field generated by the low level output of various transducers. Also, various means other than those disclosed may be utilized for forming a current loop upon a semiconductor substrate. It should also be noted that various physical relationships of the current loop 27 and high temperature super conductor magnetometer 29 are contemplated. That is, the current loop 27 should be formed in such a physical relationship to the high temperature super conductor magnetometer 29 as to provide maximum magnetic flux coupling. Therefore, physical arrangements are contemplated wherein the coils of the current loop 27 receive and encircle portions of the high temperature super conductor magnetometer. Thus, these and other modifications and additions may be obvious to those skilled in the art and may be implemented to adapt the present invention for use in a variety of different applications.

What is claimed is:

1. An input circuit for communicating signals between infrared detector elements and associated signal processing circuitry while isolating the detector elements from the effects of noise generated by the signal processing circuitry, the input circuit comprising:
   (a) a conductor formed into at least one current carrying loop, said conductor being connectable to a photosensitive detector element; and
   (b) a sensing circuit formed proximate said conductor, said sensing circuit being operative to sense the magnetic field formed about said conductor as a result of detector element current flowing through said conductor and said sensing circuit also being operative to generate an output signal in response thereto;
   (c) wherein the detector element is isolated from bias voltages generated by the associated input circuitry and 1/f noise is therefore reduced.

2. The input circuit as recited in claim 1 wherein said sensing circuit comprises a high temperature superconductor magnetometer.

3. The input circuit as recited in claim 2 further comprising an input amplifier for receiving and amplifying the output signal of said high temperature superconductor magnetometer and for providing an output signal.

4. The input circuit as recited in claim 3 wherein said conductor comprises more than one loop.

5. The input circuit as recited in claim 1 wherein said conductor and said sensing circuit are formed upon the surface of an integrated circuit chip.

6. A method for communicating signals between infrared detector elements and associated signal processing circuitry while isolating the detector elements from the effects of noise generated by the signal processing circuitry, the method comprising the steps of:
   a. outputting a signal from an infrared detector element;
   b. communicating the signal output from the detector element through a conductor formed into at least one current carrying loop;
   c. sensing the magnetic field formed about the conductor with a sensing circuit formed proximate said conductor.
   d. generating an output signal representative of the magnetic field sensed;
   e. wherein the detector element is isolated from the bias voltages generated by the associated input circuitry and 1/f noise is therefore reduced.

7. The method as recited in claim 6 wherein the step of sensing the magnetic field formed about the conductor with a sensing circuit comprises sensing the magnetic field formed about the conductor with a high temperature super-conductor magnetometer.

8. The method as recited in claim 7 further comprising the step of receiving the output signal of said high temperature super conductor magnetometer by an input amplifier and amplifying the received signal and providing an output signal representative of the input signal.

9. The method as recited in claim 8 wherein the step of transmitting the output signal of an infrared detector element through a conductor comprises transmitting the output of an infrared detector element through more than one current loop.

* * * * *